(12) United States Patent
Biber et al.

(10) Patent No.: US 9,903,897 B2
(45) Date of Patent: Feb. 27, 2018

(54) IDENTIFYING TRANSMISSION/RECEPTION COILS OF A MAGNETIC RESONANCE IMAGING SCANNER WITH THE AID OF ELECTRONICALLY READABLE LABELS

(71) Applicants: Stephan Biber, Erlangen (DE); Gerhard Metz, München (DE)

(72) Inventors: Stephan Biber, Erlangen (DE); Gerhard Metz, München (DE)

(73) Assignee: Siemens Aktiengesellschaft, München (DE)

( * ) Notice: Subject to any disclaimer, the term of this patent is extended or adjusted under 35 U.S.C. 154(b) by 269 days.

(21) Appl. No.: 13/974,573

(22) Filed: Aug. 23, 2013

(65) Prior Publication Data

US 2014/0055148 A1   Feb. 27, 2014

(30) Foreign Application Priority Data

Aug. 23, 2012 (DE) .................. 10 2012 215 006

(51) Int. Cl.
| | |
|---|---|
| *G01R 33/36* | (2006.01) |
| *G01R 33/3415* | (2006.01) |
| *G01R 27/28* | (2006.01) |
| *G01R 33/20* | (2006.01) |
| *G01R 33/32* | (2006.01) |
| *G01R 33/24* | (2006.01) |

(Continued)

(52) U.S. Cl.
CPC .............. *G01R 27/28* (2013.01); *G01R 33/36* (2013.01); *G01R 33/3692* (2013.01); *G01R 33/20* (2013.01); *G01R 33/24* (2013.01); *G01R 33/288* (2013.01); *G01R 33/32* (2013.01); *G01R 33/341* (2013.01); *G01R 33/3415* (2013.01)

(58) Field of Classification Search
CPC .. G01R 27/28; G01R 33/288; G01R 33/3415; G01R 33/3692; G01R 27/00; G01R 33/00; G01R 33/20; G01R 33/24; G01R 33/32; G01R 33/34; G01R 33/341; G01R 33/36
USPC .......................... 324/629, 600, 546; 629/546
See application file for complete search history.

(56) References Cited

U.S. PATENT DOCUMENTS

| | | | | |
|---|---|---|---|---|
| 5,939,883 | A | * 8/1999 | Green .............. | G01R 33/34061 324/318 |
| 6,023,166 | A | * 2/2000 | Eydelman ........ | G01R 33/34053 324/318 |

(Continued)

FOREIGN PATENT DOCUMENTS

| | | |
|---|---|---|
| DE | 10314215 B4 | 11/2006 |
| WO | WO2005017548 A1 | 2/2005 |

OTHER PUBLICATIONS

German Office Action cited in German Application No. 10 2012 215 006.4, dated May 23, 2013.

*Primary Examiner* — Hoai-An D Nguyen
(74) *Attorney, Agent, or Firm* — Lempia Summerfield Katz LLC

(57) ABSTRACT

A device for identifying a local coil property of a local coil for a magnetic resonance imaging scanner includes at least one label configured to transmit at least one identity number wirelessly. The device also includes at least one reading unit with a reading-unit antenna. The reading unit is configured to receive the at least one identity number. The device includes an identification apparatus configured to identify a local coil property of the local coil based on the at least one received identity number.

22 Claims, 5 Drawing Sheets

(51) Int. Cl.
*G01R 33/341* (2006.01)
*G01R 33/28* (2006.01)

(56) References Cited

U.S. PATENT DOCUMENTS

| | | | | |
|---|---|---|---|---|
| 6,446,208 | B1* | 9/2002 | Gujar | G06K 7/0008 |
| | | | | 713/184 |
| 7,106,199 | B2* | 9/2006 | Lee | G06K 19/0717 |
| | | | | 235/492 |
| 7,230,425 | B2* | 6/2007 | Leussler | 324/318 |
| 8,063,783 | B2* | 11/2011 | Miyashita | B65H 37/04 |
| | | | | 235/380 |
| 8,115,496 | B2* | 2/2012 | Kimura | 324/551 |
| 9,489,813 | B1* | 11/2016 | Beigel | G08B 13/2417 |
| 2003/0179151 | A1* | 9/2003 | Senba | G06K 19/0723 |
| | | | | 343/895 |
| 2005/0253584 | A1* | 11/2005 | Campagna | G01R 33/3415 |
| | | | | 324/318 |
| 2008/0238885 | A1* | 10/2008 | Zachut | G06F 3/03545 |
| | | | | 345/174 |
| 2009/0027053 | A1* | 1/2009 | Decke | A61B 5/0555 |
| | | | | 324/318 |
| 2009/0058607 | A1* | 3/2009 | Hou | G06K 7/10079 |
| | | | | 340/10.1 |
| 2009/0146898 | A1* | 6/2009 | Akiho | H01Q 7/06 |
| | | | | 343/787 |
| 2010/0052682 | A1 | 3/2010 | Mueller | |
| 2010/0182005 | A1* | 7/2010 | Biber | G01R 33/341 |
| | | | | 324/307 |
| 2011/0181287 | A1* | 7/2011 | Ito et al. | 324/318 |
| 2013/0082707 | A1* | 4/2013 | Biber | G01R 33/583 |
| | | | | 324/309 |
| 2013/0271129 | A1* | 10/2013 | Kess | G01R 33/36 |
| | | | | 324/307 |
| 2013/0342198 | A1* | 12/2013 | Vester | G01R 33/3692 |
| | | | | 324/307 |

* cited by examiner

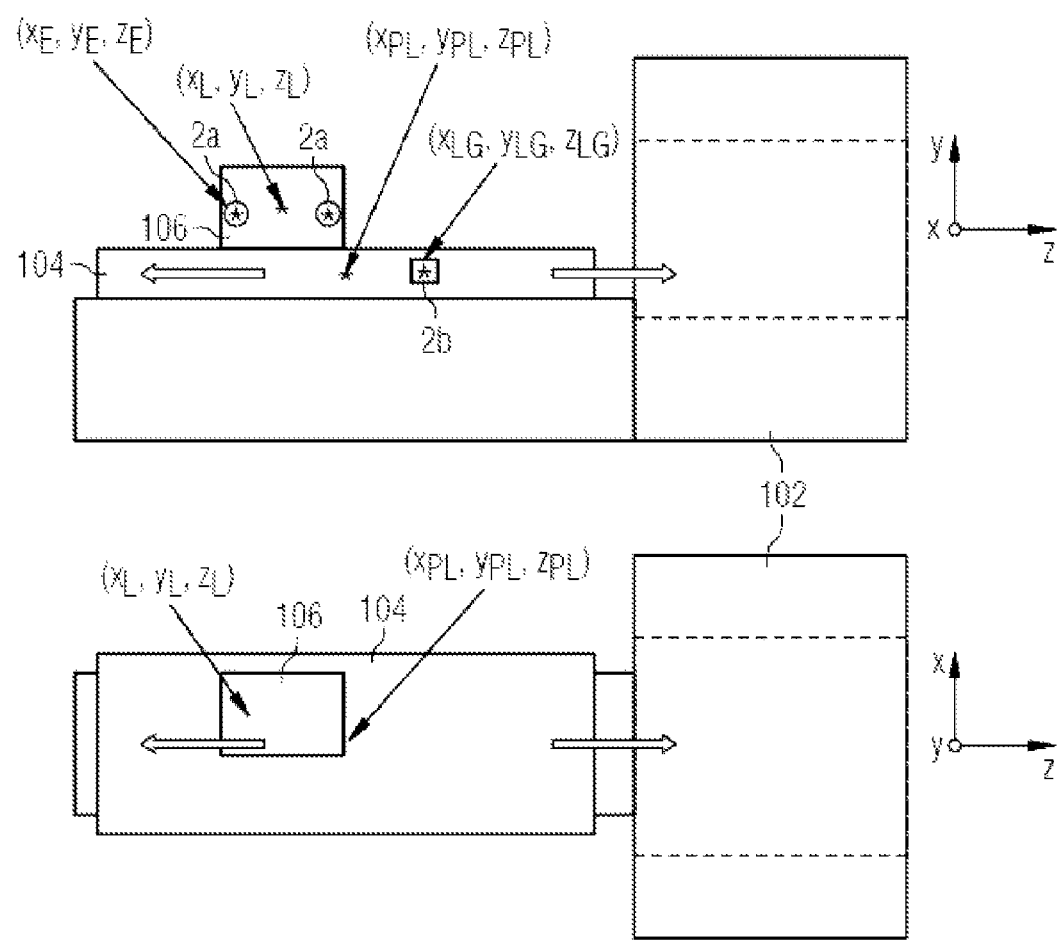

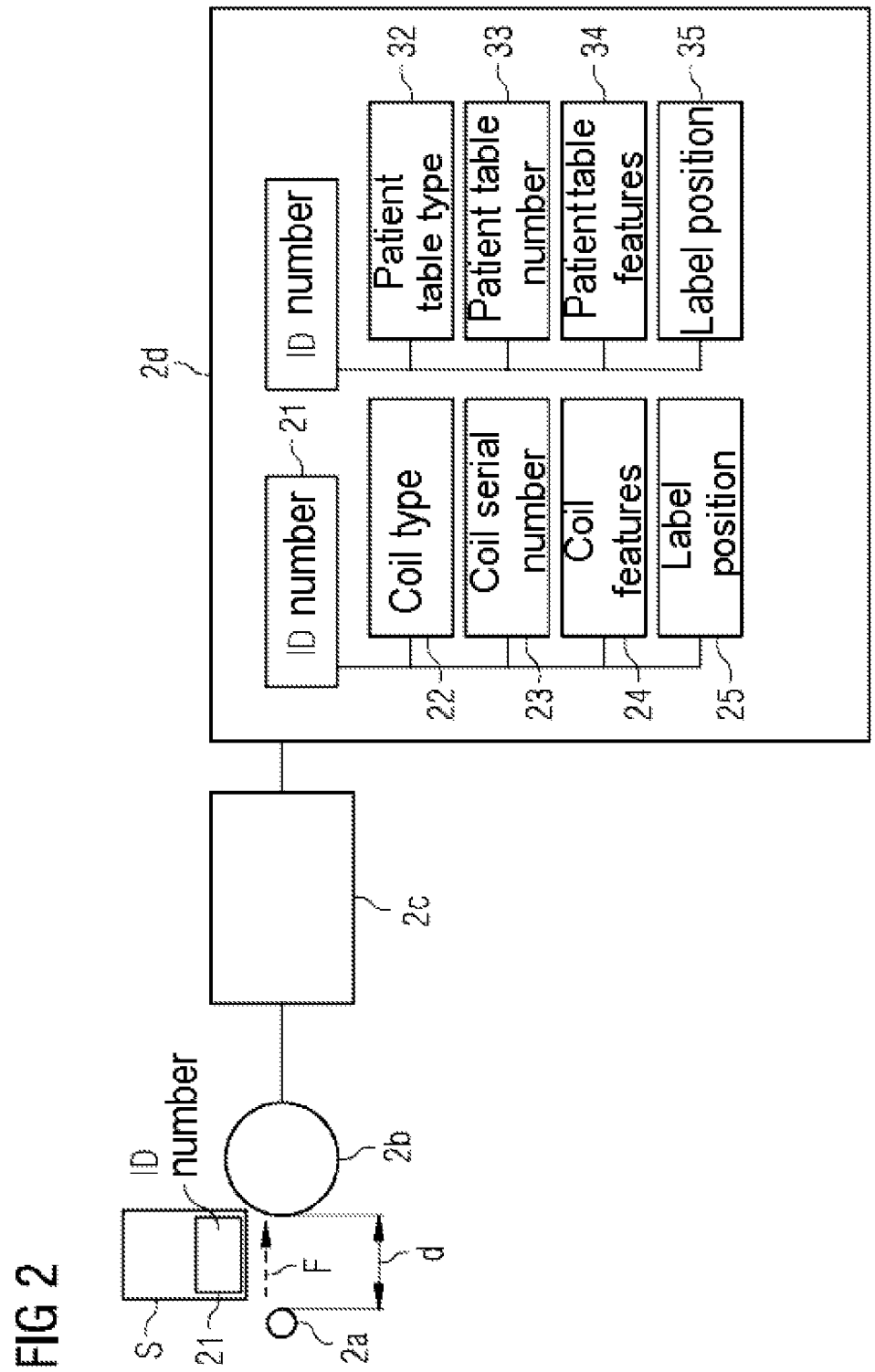

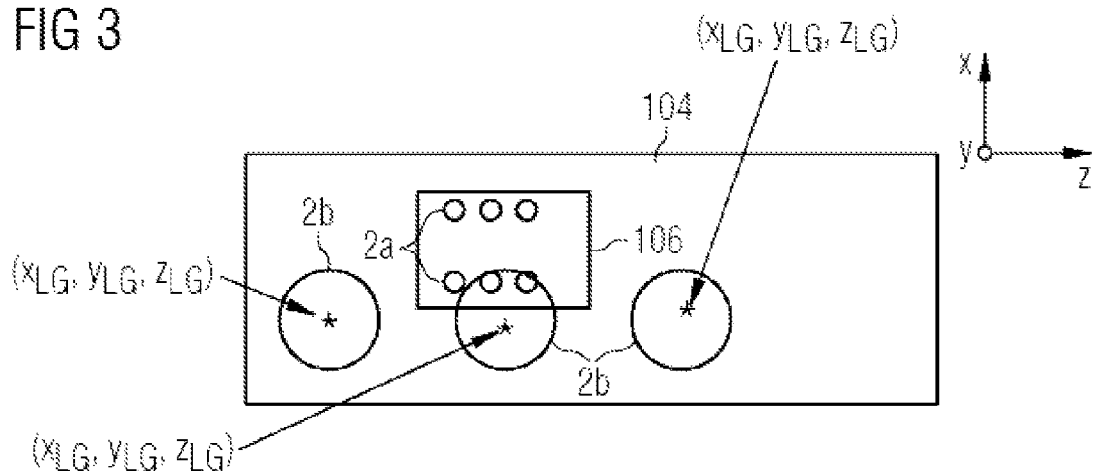
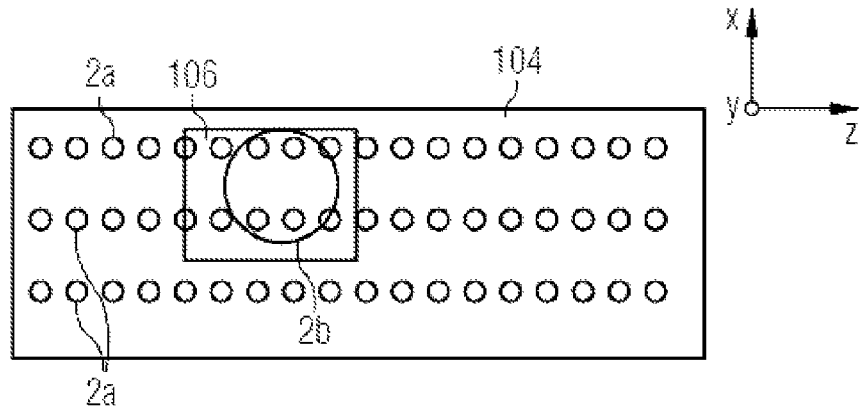

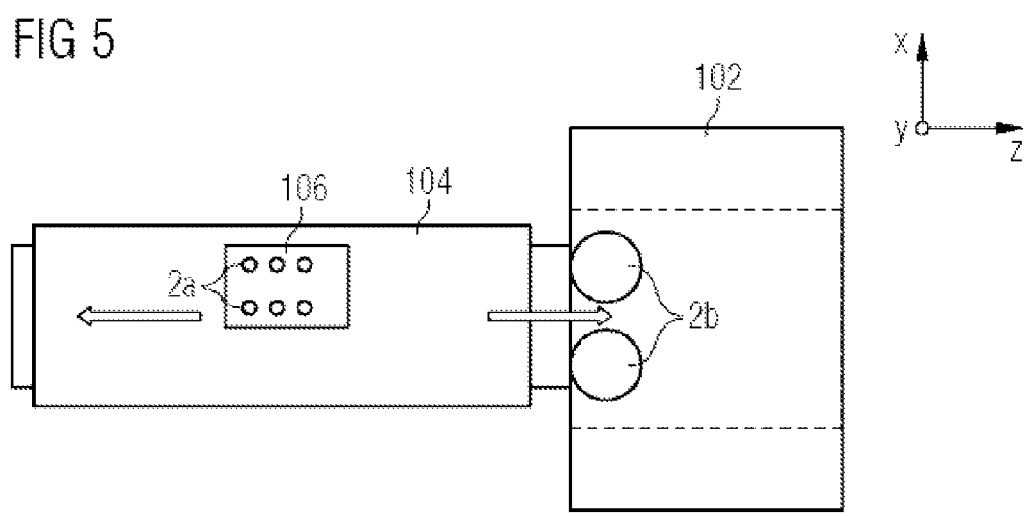

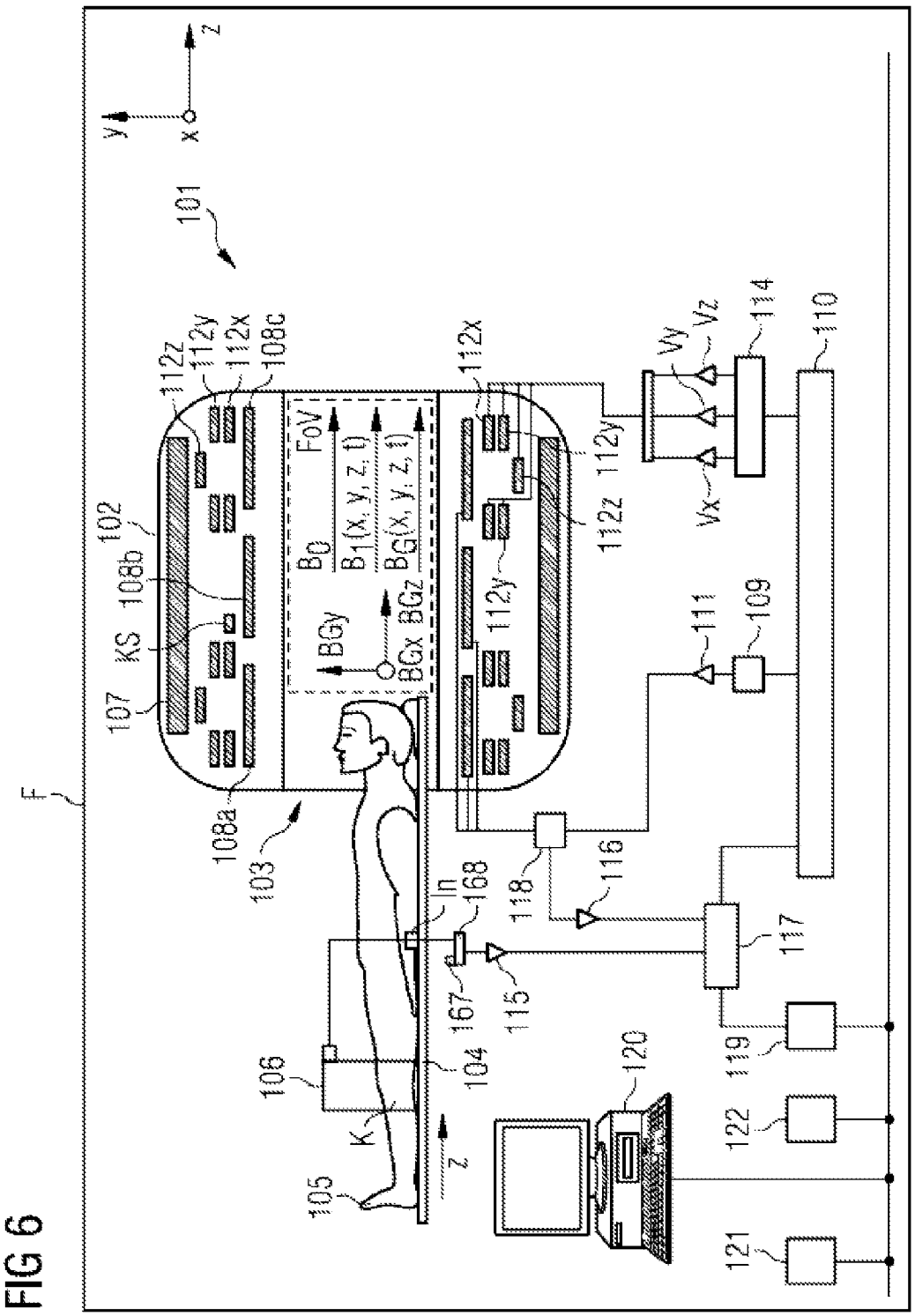

IDENTIFYING TRANSMISSION/RECEPTION COILS OF A MAGNETIC RESONANCE IMAGING SCANNER WITH THE AID OF ELECTRONICALLY READABLE LABELS

This application claims the benefit of DE 10 2012 215 006.4, filed on Aug. 23, 2012, which is hereby incorporated by reference.

BACKGROUND

The present embodiments relate to methods and devices for identifying position of transmission/reception coils of an MRI scanner.

Magnetic resonance imaging (MRI) scanners for examining objects or patients by magnetic resonance imaging are known from, for example, DE10314215B4.

SUMMARY

The scope of the present invention is defined solely by the appended claims and is not affected to any degree by the statements within this summary.

The present embodiments may obviate one or more of the drawbacks or limitations in the related art. For example, identification of transmission/reception coils of a magnetic resonance imaging scanner is optimized.

BRIEF DESCRIPTION OF THE DRAWINGS

FIG. 1 shows, in a side view at the top of FIG. 1 and in a top view at the bottom of FIG. 1, one embodiment of a local coil as a transmission/reception coil on a patient couch during entry into a bore of a magnetic resonance imaging (MRI) scanner;

FIG. 2 shows one embodiment including a label, a reading unit and a database with local coil identity numbers;

FIG. 3 shows a top view of one embodiment of a local coil provided with six labels on a patient table on which (on a spinal column coil thereof arranged therein) reading unit reading antennas are arranged for reading signals emitted by the labels;

FIG. 4 shows a top view of one embodiment of a local coil provided with a reading-unit reading antenna on a patient table on which (on a spinal column coil thereof arranged therein) labels are arranged for transmitting signals for the reading-unit reading antennas;

FIG. 5 shows a top view of one embodiment of a local coil provided with six labels on a patient table and an MRI scanner bore, on which reading-unit reading antennas for reading signals emitted by the labels are arranged; and FIG. 6 shows one embodiment of an MRI system.

DETAILED DESCRIPTION

FIG. 6 shows a magnetic resonance imaging (MRI) scanner 101 (e.g., situated in a shielded room or in a Faraday cage F) with a whole body coil 102 with a space 103 (e.g., tubular), in which a patient couch 104 (e.g., a patient table) with a body of, for example, an examination object 105 (e.g., of a patient; with or without local coil arrangement 106) may be driven in the direction of the arrow z in order to generate images (e.g., of the knee K) of the patient 105 by an imaging method. Arranged on the patient is, for example, a local coil arrangement 106 (e.g., connected to an MRI scanner control 117, 110 via an interface in or on the patient couch 104), by which, in a local region (e.g., field of view or FOV) of the MRI scanner, recordings of a portion of the body 105 may be generated in the FOV. Radio frequency (RF) signals received by the local coil arrangement 106 may be evaluated (e.g., converted into images, stored or displayed) by an evaluation apparatus (e.g., including elements 168, 115, 117, 119, 120, 121) of the MRI scanner 101 that may be connected to the local coil arrangement 106 by, for example, coaxial cables or by radio (e.g., element 167).

In order to use a magnetic resonance imaging MRI scanner 101 to examine the body 105 (e.g., an examination object or a patient) using magnetic resonance imaging, different magnetic fields are radiated onto the body 105. The magnetic fields are matched very precisely to one another in terms of temporal and spatial characteristics. A strong magnet (e.g., a cryo-magnet 107) in a measuring cabin with an opening 103 (e.g., tunnel-shaped) generates a static strong main magnetic field $B_0$ that may be, for example, 0.2 tesla to 3 tesla or more. A body 105 to be examined, supported by a patient couch 104, is driven into a region of the main magnetic field $B_0$ that is approximately homogeneous in the observation region FoV. Nuclear spins of atomic nuclei of the body 105 are excited by magnetic radiofrequency excitation pulses $B1(x, y, z, t)$ that are, for example, radiated in by a radiofrequency antenna that is illustrated in a highly simplified fashion as body coil 108 (e.g., multi-part body coil 108a, 108b, 108c; and/or, optionally, a local coil arrangement). Radiofrequency excitation pulses are generated by, for example, a pulse generation unit 109 that is controlled by a pulse sequence control unit 110. After amplification by a radiofrequency amplifier 111, the pulses are routed to the radiofrequency antenna 108. The radiofrequency system shown is merely indicated schematically. In other embodiments, more than one pulse generation unit 109, more than one radiofrequency amplifier 111 and a plurality of radiofrequency antennas 108a, b, c are employed in a magnetic resonance imaging scanner 101.

The magnetic resonance imaging scanner 101 includes gradient coils 112x, 112y, 112z, by which magnetic gradient fields $B_G(x, y, z, t)$ for selective slice excitation and for spatial encoding of the measurement signal are radiated in during a measurement. The gradient coils 112x, 112y, 112z are controlled by a gradient coil control unit 114 (and optionally via amplifiers Vx, Vy, Vz) that, like the pulse generation unit 109, is connected to the pulse sequence control unit 110.

RF signals emitted by the excited nuclear spins (of the atomic nuclei in the examination object) are received by the body coil 108 and/or at least one local coil arrangement 106, amplified by associated radiofrequency preamplifiers 116 and processed further and digitized by a reception unit 117. The recorded measurement data is digitized and stored as complex number values in a k-space matrix. An associated MRI image may be reconstructed from the k-space matrix filled with values using a multidimensional Fourier transform.

For a coil that may be operated both in the transmission and in the reception mode such as, for example, the body coil 108 or a local coil 106, the correct signal transmission is regulated by an upstream transmission/reception switch 118.

An image processing unit 119 generates an image from the measurement data. The image is displayed to a user via an operating console 120 and/or stored in a storage unit 121. A central computer unit 122 controls the individual components of the installation.

In MR imaging, images with a high signal-to-noise ratio (SNR) may be recorded using local coil arrangements (e.g., coils, local coils). The local coil arrangements are antenna systems that are attached in the direct vicinity on (anterior), under (posterior), at, or in the body 105. During an MR measurement, the excited nuclei induce a voltage in the individual antennas of the local coil. The induced voltage is amplified using a low-noise preamplifier (e.g., LNA, pre-amp) and relayed to the reception electronics. In order to improve the signal-to-noise ratio, even in the case of high-resolution images, high field installations (e.g., 1.5 T-12 T or more) are used. If it is possible to connect more individual antennas to an MR reception system than there are receivers available, then, for example, a switching matrix (e.g., RCCS) is installed between reception antennas and receiver. The switching matrix routes the currently active reception channels (e.g., the reception channels that currently lie in the field of view of the magnet) to the available receivers. As a result of this, more coil elements than there are receivers available may be connected since, in the case of a whole body coverage, only the coils that are situated in the FoV (field of view) or in the homogeneity volume of the magnet are to be read out.

By way of example, an antenna system that may, for example, include one antenna element or, as an array coil, a plurality of antenna elements (e.g., coil elements) may be referred to as local coil arrangement 106. These individual antenna elements are, for example, embodied as loop antennas (e.g., loops), butterfly coils, flex coils, or saddle coils. By way of example, a local coil arrangement includes coil elements, a preamplifier, further electronics (e.g., sheath current chokes), a housing, supports and may include a cable with plugs, by which the coil elements are connected to the MRI scanner. A receiver 168, attached on the installation side, filters and digitizes a signal received from a local coil 106 (e.g., by radio) and transmits the data to a digital signal processing apparatus that may derive an image or a spectrum from the data obtained by a measurement and makes the image or spectrum available to the user for, for example, a subsequent diagnosis by the user and/or for storage purposes.

In accordance with FIG. 1, a patient 105 is, in the case of an MRI scanner 101, transported into the measurement region FoV of the MRI scanner 101 (e.g., when lying on a table or patient table 104) and transported out again (e.g., in the direction of the arrows in FIG. 1). In some measurement methods, local coils 106 (e.g., local coil arrays made of several antennas or local coils with only one antenna or local coil arrangement) are attached on the patient table 104 in the vicinity of the body tissue (e.g., of the knee K) to be examined. The local coils serve for receiving and/or transmitting electromagnetic RF signals out of the body. There are a plurality of different local coil types, and many local coils 106 have individual features. So that the whole MRI measurement system may operate in good order, the number, the type and the individual features of each local coil 106 may be unambiguously identified by the system 101, 110.

In accordance with one embodiment, each local coil 106 and/or the patient table 104 is provided with one or more electronically wirelessly readable labels 2a. Each label 2a carries a unique identity number 21 (e.g., an ID number) that has only been allocated once in the label. Relevant data 22-25 with respect to local coils 106 and/or the patient table 104 or the patient tables 104 are stored in a database 2d. As a result, the MRI measuring system 101, 110 is able to identify precisely the number of local coils 106, the type of local coils 106, each individual local coil 106, and the patient table 104, on which the local coils 106 are assembled. The measurement system matching thereto may also be set. Additionally, the system 101, 110 may identify if incorrect (e.g., not fitting to the currently utilized measurement method or MRI scanner type (field strength, manufacturer), no longer functional, or an inadmissible number of local coils 106 are attached and/or arranged on the patient table 104.

Since an identification of the local coils 106 is to be provided for the MRI measurement system, this was previously solved differently in accordance with known variants. In some MRI systems, all local coils 106 are connected to the patient table 104 and therefore to the measurement system using one or more cables and one or more plug-in connections. In addition to the signal lines, which are used to operate the coils, electric signals for identifying the local coil 106 may be transmitted on additional lines. Solutions using analog codes (e.g., resistant codes) and digital solutions with a storage medium in the local coil (e.g., EEPROM, flash) are known. A disadvantage of this solution may be that the identification may only take place provided that there is a correct plug-in connection. Local coils 106 that are not connected to the system or incorrectly connected to the system (e.g., user forgets the connection, cables are defective) may therefore not be identified and may, under certain circumstances, lead to undesired states of the system that may even lead to the extent of an impairment of patient safety.

By way of example, in accordance with an embodiment shown in FIG. 1, the patient lies, for example, on the patient table 104 during an MRI recording. The local coil 106 (e.g., local coil arrangement, local coil array) is attached to the patient table 104 at a body site K to be examined and, for example, connected with the patient table 104 to the MRI system 101, 110 via a cable. For the actual MRI recording, the patient table 104 with patient 105 and local coil 106 is inserted into the MRI scanner housing 101 or bore 103 and subsequently removed therefrom again. In contrast to other local coil 106 identification systems on a magnetic resonance imaging scanner, local coils (e.g., local coil arrangements) are identified at the patient table 104 in this embodiment with the aid of electronically wirelessly transmitting (e.g., RFID) signals (S) and readable (e.g., RFID) labels 2a.

In accordance with FIG. 2, an embodiment of a system or a device includes at least one reading unit 2c with one or more integrated or separated reading antennas 2b and at least one electronically readable label 2a. Stored in each label 2a is at least one identity number 21 that is only allocated once (in this label) and is transmitted wirelessly by the reading unit 2c over a definable distance d by signals (e.g., RFID signals) between the reading antenna 2b and the label 2a. The at least one identity number 21 may therefore be read. Using the read identity number 21 of the label 2a, the MRI system 101, 110, 2d establishes at least the following data from a database 2d: coil type 22, coil serial number 23, coil features 24, label position 25 on the coil, patient table type 32, patient table serial number 33, patient table features 34, label position 35 on the patient table 104.

For example, the following variants may be provided as embodiments of an identification of local coils 106 by an MRI system 101. In accordance with FIG. 3, one or more electronically readable labels 2a are attached to the housing of the local coil 106 or integrated into the housing. One or more reading units 2c and/or the associated reading antennas 2b are attached to or in the vicinity of the patient table 104 or integrated into the patient table 104. If a local coil 106 is brought into the vicinity of the patient table 104 (e.g., into the adjustable reading region of a reading unit 2c), then the identity number 21 of one or more labels 2a housed on or in the coil housing may be read by the MRI system. If several reading units 2c and/or reading antennas 2b are used on a patient table 104, conclusions may be drawn from the information in relation to which reading antennas 2b were able to read the label 2a in relation to which region on or over the patient table 104 the label and hence the coil housing is situated (e.g., position determination). As a result of this, it is also possible to identify if more than one local coil 106 is brought into the vicinity of the patient table 104. Coil-related data (e.g., at least coil type 22, coil serial number 23, coil features 24, label position 25 on the local coil) is established from the read identity number 21 with the aid of the database 2d.

In accordance with FIG. 4, one or more electronically readable labels 2a are attached to the patient table 104 or integrated into the patient table 104. One or more reading units 2c or only the associated reading antennas 2b are attached to the housing of the local coil 106 (e.g., in FIG. 4) or integrated into the housing. If a local coil 106 is brought into the vicinity of the patient table 104 (e.g., into the adjustable reading region of a reading unit 2c), then the identity number 21 of one or more labels 2a housed on or in the patient table 104 may be read by one or more reading units in the local coil 106. If several labels 2a are attached distributed on or in the patient table 104, conclusions may be drawn from the identity numbers 21 of the read labels 2a in relation to which region on or over the patient table 104 the reading antenna(s) 2b and hence the coil housing of the local coil connected thereto is/are situated (e.g., position determination). As a result of communication between the coil or the coil arrangement and the MRI system, the overall system 101, 110, 2d may also identify if more than one local coil 106 is situated in the vicinity of the patient table 104 (e.g., thereon). Patient table-related data (e.g., at least patient table type 32, patient table serial number 33, patient table features 34, label position 35 on the patient table) is established from the read identity number 21 with the aid of the database 2d. The patient table data 32-25 may also be read by a reading antenna 2b on the system (e.g., on the bore; also, instead of the local coil). The reading process is independent of the connection between the local coil 106 and the system.

The embodiments above may also be combined. One or more electronically readable labels 2a may be attached to or integrated in the patient table 104 and attached to or integrated in the housing of the local coil 106. Similarly, one or more reading units 2c with, in each case, one or more reading antennas 2b are attached both in the vicinity of or in the patient table 104 and also on or in the housing of the local coil 106. Using known methods (e.g., temporally separated operation or combination of different label systems), a negative influence between the individual reading unit/label systems may be avoided. The coil housings (e.g., of local coils 106 with labels 2a and/or reading unit antennas 2b) may be identified by the patient table 104, and the patient table 104 (e.g., with labels 2a and/or reading unit antennas 2b) may be identified by the local coil 106. By combining this data, the identification reliability and the accuracy of the position determination may be increased. Patient table-related and/or local coil-related data (e.g., at least patient table type 32, patient table serial number 33, patient table features 34, label position 35 on the patient table, coil type 22, coil serial number 23, coil features 24, and/or label position 25 on the local coil) are established, depending on reference point of the label 2a, from the read identity number 21 with the aid of the database 2d.

By way of example, in accordance with FIG. 5, one or more electronically readable labels 2a are attached to the housing of the local coil(s) 106 or integrated into the housing. One or more reading units 2c and/or the associated reading antennas 2b are attached on or in the vicinity of the MRI scanner housing 101 (e.g., on/in the MRI scanner measurement tube or bore 103) or integrated into the MRI scanner housing 101, 103. In the case of a large reading range, the reading system may already identify the local coil 106 in the vicinity of the patient table 104 when the table is still situated outside of the MRI scanner housing (e.g., it may be the case that only rough position determination may be provided). In the case of a smaller reading range, the local coil 106, which is situated in the vicinity of the patient table 104, is only identified when the table enters the MRI scanner housing (e.g., MRI scanner measurement tube; more precise position determination may be provided). An advantage may be a small required number of reading units 2c or reading antennas 2b. A disadvantage may be that the local coils 106 are, in the case of a small reading range, only identified just before the local coil 106 enters the MRI scanner housing. The measurement system may therefore only have a little time to decide whether the insertion is to be aborted or reversed. Local coil-related data are established from the read identity number 21 with the aid of the database 2d, as described above.

Compared to known previous identification systems of local coils 106 at a magnetic resonance imaging scanner, employment of electronically readable labels 2a may result in the advantage that the identification of one or more local coils 106 of the measurement system may take place independently of the correct electrical connection between the local coils and the patient couch and/or the MRI system using cables. The arrangement or mechanical attachment of the local coil(s) on the patient table may suffice for the system to be able to decide whether or not safe operation may be undertaken with this arrangement. As a result of the fact that each local coil 106 is identified with individual features, the system may be optimally set to the selected arrangement. Reading the electronically readable labels 2a may be brought about over a broad and adjustable distance region between reading unit 2c or reading antenna 2b and label 2a. As a result, the local coils 106 may also be identified when the housings of the local coils 106 do not completely exactly engage into the rails and/or holding points provided therefore.

The fact that the measurement system may identify an inexpedient or forbidden number or combination of local coils 106 may likewise have an advantageous effect. If too few (e.g., no) or too many (e.g., three) local coils 106 for the envisaged measurement mode are attached to the patient table 104, the measurement system may refuse to carry out the measurement and provide the operating staff with appropriate advice.

Good system and patient safety is achieved by the combination of the system achievements. The MRI system equipped with one or more of the present embodiments only accepts an envisaged number and combination of local coils 106 and only admissible coil types for the set measurement mode. In any other case, the system will not carry out the measurement and will generate error messages.

An additional use of this embodiment of the method includes the detection of local coils 106 not plugged onto the MRI system. This identification may also be of assistance for satisfying the "IEG 60601 2nd Edition" standard and may make other test methods obsolete.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A device for identifying a local coil property of a local coil for a magnetic resonance imaging scanner, the device comprising:
   a plurality of labels integrated within the local coil, wherein the local coil is positionable on a patient table, and wherein each label of the plurality of labels stores a unique identity number and is configured to transmit the respective identity number wirelessly by a radio-frequency identification (RFID) signal;
   a reading unit comprising one or more reading-unit antennae integrated within the patient table, the reading unit configured to receive the identity number of each label when the local coil is positioned on the patient table; and
   an identification apparatus configured to determine a position of each label of the plurality of labels.

2. The device as claimed in claim 1, wherein the device is configured to detect the local coil without a wired connection of the local coil to a magnetic resonance imaging (MRI) system.

3. The device as claimed in claim 1, wherein the device is configured to identify an inexpedient or forbidden number or combination of local coils, to detect too few or too many local coils attached to the patient table for a measurement mode of the magnetic resonance imaging (MRI) scanner, or a combination thereof.

4. The device as claimed in claim 1, wherein the device is configured to determine local coils not plugged onto the magnetic resonance imaging (MRI) scanner, the patient table, or the MRI scanner and the patient table by a comparison of the local coils detected by received identity numbers with local coils plugged onto the MRI scanner, the patient table, or the MRI scanner and the patient table, the local coil being one of the local coils, the identity number being one of the identity numbers.

5. The device as claimed in claim 1, wherein the plurality of labels comprises a label that transmits the identity number, a label that is readable wirelessly by the reading unit, or a label that transmits the identity number and is readable wirelessly by the reading unit.

6. The device as claimed in claim 1, wherein the plurality of labels comprises an RFID label operable to transmit the RFID signal, and
   wherein the reading unit is an RFID reading unit.

7. The device as claimed in claim 1, wherein the identity number, only stored in a label of the plurality of labels, is stored in the label of the plurality of labels in a storage medium.

8. The device as claimed in claim 1, wherein the one or more reading-unit antennae are configured to read signals that are emitted by the plurality of labels and transmit the identity number, the RFID signals, radio signals, or a combination thereof.

9. The device as claimed in claim 1, wherein the reading unit comprises one or more integrated or spatially separated reading antennas.

10. The device as claimed in claim 1, wherein the identification apparatus is configured to establish, with a database, data relating to the local coil property of the local coil for the identity number received wirelessly from each label of the plurality of labels using a reading-unit antenna of the one or more reading-unit antennae, and
    wherein the data comprises data relating to a local coil type of the local coil, data representing a coil serial number of the local coil, or a combination thereof.

11. The device as claimed in claim 1, wherein, by using a reading-unit antenna of the one or more reading-unit antennae, signals, a signal strength of the signals, or the signals and the signal strength of the signals are readable from each label of the plurality of labels, and
    wherein the device is configured to determine a position of the local coil on which the plurality of labels is arranged.

12. The device as claimed in claim 1, further comprising a database, in which at least one local coil property is stored for each identity number of one or more identity numbers, the identify number being one of the one or more identity numbers.

13. The device as claimed in claim 1, further comprising a plurality of reading units, a plurality of reading antennas, or the plurality of reading units and the plurality of reading antennas, the reading unit being one of the plurality of reading units.

14. The device as claimed in claim 1, wherein the local coil is a local coil arrangement with only one antenna or one local coil array.

15. The device as claimed in claim 1, further comprising:
    a separate plurality of labels integrated on the local coil or within the local coil, each label of the separate plurality of labels configured to transmit a separate identity number wirelessly;
    a separate reading unit comprising one or more reading-unit antennae integrated within the patient table, the reading unit configured to receive the separate identity number of each label of the separate plurality of labels.

16. A device for identifying a local coil property of a local coil for a magnetic resonance imaging (MRI) scanner, the device comprising:
    one or more labels integrated within a patient table, wherein each label stores a unique identity number and is configured to transmit the respective identity number wirelessly by a radio-frequency identification (RFID) signal;
    a reading unit comprising one or more reading-unit antennae integrated within the local coil, the reading unit configured to wirelessly receive the identity number; and
    an identification apparatus configured to identify the local coil property of the local coil based on the received identity number.

17. The device as claimed in claim 16, wherein the identification apparatus is further configured to:
    identify a patient table property of the patient table; and
    establish, with a database, data relating to the patient table property of the patient table for the identity number received wirelessly from a label of the one or more labels using a reading-unit antenna of the one or more reading-unit antennae, wherein the data comprises data representing a patient table type of the patient table, data representing a patient table serial number of the patient table, data representing patient table features of the patient table, data representing a position of the label on the patient table, or a combination thereof.

18. The device as claimed in claim 16, wherein, by using a reading-unit antenna of the one or more reading-unit antennae, signals, a signal strength of the signals, or the signals and the signal strength of the signals are readable from a label of the one or more labels, and wherein the device is configured to determine a position of the label, a position of the patient table, in which the label is integrated, or the position of the label and the position of the patient table, in which the label is integrated.

19. The device as claimed in claim 16, wherein the one or more labels comprises a plurality of electronically readable labels.

20. The device as claimed in claim 16, wherein the one or more reading-units comprises a plurality of reading units, and wherein the plurality of reading units is integrated within the local coil.

21. A method for identifying a local coil property of a local coil for a magnetic resonance imaging scanner, the method comprising:

positioning the local coil on a patient table, wherein the local coil comprises a plurality of labels integrated within the local coil, and wherein each label of the plurality of labels stores a unique identity number;

transmitting the respective identity number wirelessly by each label of the plurality of labels by a radio-frequency identification (RFID) signal;

receiving, with a reading unit antenna of a reading unit integrated within a patient table, the transmitted identity number of each label when the local coil is positioned on the patient table; and identifying, with an identifying apparatus, a position of each label of the plurality of labels due to the identity number of each label.

22. The method of claim 21, further comprising:

determining, based on the identifying, whether the local coil is connected to the magnetic resonance imaging scanner, incorrectly connected to the magnetic resonance imaging scanner, or not functional.

* * * * *